United States Patent

Huang et al.

[11] Patent Number: 6,027,969
[45] Date of Patent: Feb. 22, 2000

[54] CAPACITOR STRUCTURE FOR A DYNAMIC RANDOM ACCESS MEMORY CELL

[75] Inventors: Kuo Ching Huang, Kaohsiung; James Wu, Kao-Shiung, both of Taiwan

[73] Assignee: Taiwan Semiconductor Manufacturing Company, Hsin-Chu, Taiwan

[21] Appl. No.: 09/090,497

[22] Filed: Jun. 4, 1998

[51] Int. Cl.[7] .................................. H01L 21/8242
[52] U.S. Cl. .................... 438/254; 438/244; 438/253; 438/387; 438/396; 438/397; 257/303; 257/306; 257/308; 257/309
[58] Field of Search ............................ 257/303, 306, 257/307, 308, 309; 438/244, 253, 254, 255, 387, 396, 397, 398

[56] References Cited

U.S. PATENT DOCUMENTS

| | | | |
|---|---|---|---|
| 4,974,040 | 11/1990 | Taguchi et al. | 357/23.6 |
| 5,116,776 | 5/1992 | Chan et al. | 437/52 |
| 5,128,273 | 7/1992 | Ema | 437/52 |
| 5,597,755 | 1/1997 | Ajika et al. | 438/396 |
| 5,851,876 | 12/1998 | Jenq | 438/253 |
| 5,863,821 | 1/1999 | Chao | 438/253 |

*Primary Examiner*—Carl Whitehead, Jr.
*Assistant Examiner*—Toniae M. Thomas
*Attorney, Agent, or Firm*—George O. Saile; Stephen B. Ackerman

[57] ABSTRACT

A method for increasing the surface area, and thus the capacitance of a DRAM, stacked capacitor structure, has been developed. A storage node electrode, incorporating branches of polysilicon, is created via use of multiple polysilicon and insulator depositions, as well as via the use of dry anisotropic, and wet isotropic, etching procedures. The use of polysilicon spacers, created on the sides of silicon oxide mesas, adds a vertical component to the polysilicon branches. Removal of a portion of insulator layer from between polysilicon branches, results in exposure of the increased storage node electrode surface area. Unetched portions of the insulator layers, between polysilicon branches, supply structural support for the storage node electrode, comprised of polysilicon branches.

24 Claims, 5 Drawing Sheets

CAPACITOR STRUCTURE FOR A DYNAMIC RANDOM ACCESS MEMORY CELL

BACKGROUND OF THE INVENTION

(1) Field of the Invention

The present invention relates to methods used to fabricate semiconductor devices, and more specifically to a method used to fabricate a dynamic random access memory, (DRAM), device, with increased capacitance, resulting via the use of a novel configuration for the storage node structure, of a stacked capacitor structure.

(2) Description of Prior Art

The semiconductor industry is continually striving to improve the performance of semiconductor devices, while still maintaining, or even decreasing the manufacturing cost of these same semiconductor devices. The advent of micro-miniaturization, or the ability to fabricate semiconductor devices, with sub-micron features, has allowed the industry's performance and cost objectives to be successfully addressed. The use of sub-micron features result in decreases in performance degrading capacitances and resistances, thus allowing improved device performance to be realized. In addition the use of micro-miniaturization allows smaller chips, still containing circuit densities comparable to circuit densities obtained with larger semiconductor chips, to be fabricated. This in turn results in an increase in the amount of semiconductor chips obtained from a specific size starting substrate, thus resulting in a reduction of manufacturing cost of a specific chip.

Dynamic random access memory, (DRAM), devices, are being fabricated using a stacked capacitor, (STC), structure, overlying a transfer gate transistor. The shrinking of device features has resulted in a decrease in STC dimensions, therefore the capacitance of the STC structure, influenced by the dimensions of the storage node electrode, has to be increased via other means. The use of thinner capacitor dielectric layers, or of higher dielectric constant materials, used to increase STC capacitance, is limited by process complexity or yield concerns. Therefore the DRAM community has focused on capacitance increases via the creation of storage node electrodes, exhibiting unique configurations, such as a polysilicon storage node electrode, featuring horizontal and vertical polysilicon shapes, resulting in an increase in surface area when compared to counterparts, fabricated without the vertical and horizontal polysilicon features. For example prior art, such as Taguchi, et al, in U.S. Pat. No. 4,974,040, describe a polysilicon storage node electrode, fabricated using several stacked conductive layers. In addition Chen, et al, in U.S. Pat No. 5,116,776, also describe a polysilicon storage node electrode, configured to include stacked, horizontal features, again increasing the surface area of the storage node structure, when compared to configurations created without the stacked horizontal, polysilicon features.

This invention will describe a novel configuration for a polysilicon storage node electrode, characterized by several stacked, horizontal polysilicon features, however also characterized by vertical polysilicon features, each attached to a horizontal polysilicon feature, thus offering a larger surface area increase, than surface area enhancements obtained with counterparts fabricated without the vertical polysilicon feature. In addition this invention will describe a novel fabrication process, needed to create the unique, polysilicon storage node electrode configuration. The novel fabrication procedure features a process step designed to allow regions of insulator to remain, between horizontal polysilicon features, needed to physically support this polysilicon, storage node electrode configuration.

SUMMARY OF THE INVENTION

It is an object of this invention to fabricate a stacked capacitor, (STC), structure, for a DRAM device, in which the capacitance of the STC structure, is increased via use of a storage node electrode, exhibiting horizontal and vertical polysil icon features.

It is another object of this invention to use segments of insulator, between stacked horizonal polysilicon features, and between a horizontal feature, and an underlying silicon nitride layer, to structurally support the polysilicon storage node electrode, configured with horizontal and vertical polysilicon features.

It is still another object of this invention to create the vertical polysilicon features, at the end of each horizontal polysilicon feature, via creation of polysilicon sidewall spacers, on the sides of disposable insulator mesas.

It is still yet another object of this invention to place a capacitor dielectric layer on the surface of horizontal and vertical, polysilicon features, by removal of existing insulator layer from between the polysilicon stacks, and than forming the capacitor dielectric layer, on the exposed surfaces of the horizontal and vertical polysilicon features.

In accordance with the present invention a method is described for increasing the surface area of a polysilicon storage node electrode, by forming a storage node electrode comprised of stacks of horizontal and vertical polysilicon features. A first insulator layer is deposited on an underlying transfer gate transistor, planarized, and followed by the deposition of a silicon nitride layer, on the planarized, first insulator layer. A second insulator layer is deposited, and patterned to form insulator mesas, on the underlying silicon nitride layer, with a thinned, second insulator layer, remaining between insulator mesas. A first polysilicon layer, and a third insulator layer, are deposited, traversing the insulator mesas and the thinned second insulator layer. A storage node opening is next created between insulator mesas, in the third insulator layer, in the first polysilicon layer, in the thinned second insulator layer, in the silicon nitride layer, and in the first insulator layer, exposing a source/drain region of the transfer gate transistor. A second polysilicon layer is deposited on the third insulator layer, and on the exposed sides of the storage node opening, including the second polysilicon layer contacting the edge of the first polysilicon layer, exposed in the storage node opening. A fourth insulator layer is deposited, and planarized, exposing the top surface of the second polysilicon layer, in the region in which the second polysilicon layer is located directly over the top of the insulator mesas. A chemical mechanical polishing, (CMP), procedure is than used to remove the exposed portion of second polysilicon layer, creating a first polysilicon branch. The CMP procedure is continued by removal of the portion of the now exposed third insulator layer, than followed by the removal of the now exposed, first polysilicon layer, resulting in a second polysilicon branch, with both polysilicon branches comprised of vertical polysilicon features, formed as sidewall spacers on the sides of the storage node opening, and with each polysilicon branch containing attached horizontal segments, residing on underlying insulator layers. A wet etch procedure is next employed: to remove the insulator mesas; to remove all of the fourth insulator layer; to remove a portion of the third insulator layer from between segments of the second, and first polysilicon branches, and to remove a portion of the thinned second insulator layer, from between segments of the second polysilicon branch and the underlying silicon nitride layer. Remaining portions of the third insulator layer, and of the thinned second insulator layer, are used for structural support for the polysilicon storage node electrode. A capacitor dielectric layer is formed on all exposed surfaces of second, and first polysilicon branches, followed by the creation of an upper, polysilicon electrode, completing the fabrication of the stacked capacitor structure, featuring a polysilicon storage node structure, comprised of stacks of polysilicon branches, with each polysilicon branch featuring both vertical and horizonal, polysilicon features.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method for forming a stacked capacitor structure, for a DRAM device, featuring a polysilicon storage node electrode, comprised of stacks of polysilicon branches, each containing horizontal and vertical polysilicon features, and used to increase the surface area, and the capacitance, of the stacked capacitor structure, will now be described in detail. The DRAM device, in this invention, will be described as an N channel device, however the process for forming the storage node electrode, described in this invention, can also be applied to DRAM devices, comprised of P channel, transfer gate transistor.

Figure 1:
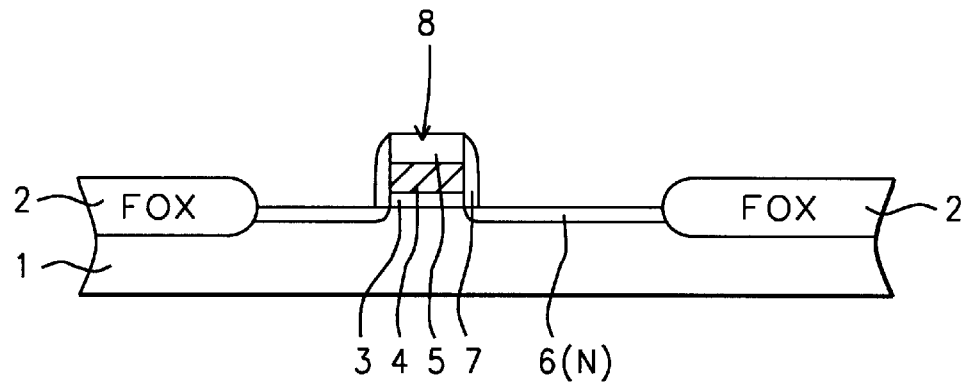
FIGS. 1–10, which schematically, in cross-sectional style, show key stages of fabrication, used to create a polysilicon storage node electrode, configured with polysilicon branches, each featuring horizontal and vertical polysilicon segments.

Referring to FIG. 1, a P type, semiconductor substrate 1, with a <100>, single crystalline orientation, is used. Field oxide, (FOX), regions 2, or shallow trench isolation, (STI), regions, are used for purposes of isolation. Briefly the FOX regions 2, are formed via thermal oxidation, in an oxygen-steam ambient, at a temperature between about 850 to 1050° C., to a thickness between about 3000 to 5000 Angstroms. A patterned oxidation resistant mask of silicon nitride-silicon oxide is used to prevent FOX regions 2, from growing on areas of semiconductor substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon dioxide is thermally grown in an oxygen-steam ambient, at a temperature between about 850 to 1050° C., to a thickness between about 50 to 200 Angstroms. A polysilicon layer 4, is next deposited using low pressure chemical vapor deposition, (LPCVD), procedures, at a temperature between about 500 to 700° C., to a thickness between about 1000 to 3000 Angstroms. The polysilicon can either be grown intrinsically and doped via ion implantation of arsenic or phosphorous, or polysilicon layer 4, can be grown using in situ doping procedures, via the incorporation of either arsine, or phosphine, to the silane ambient. If desired a metal silicide layer, such as tungsten silicide, can be deposited on polysilicon layer 4, to subsequently form a polycide gate structure, comprised of the metal silicide on polysilicon layer 4. The polycide gate structure offers a lower resistance word line than a counterpart word line, formed from only polysilicon layer 4. An insulator layer 5, comprised of silicon oxide or silicon nitride, is next deposited using LPCVD, or plasma enhanced chemical vapor deposition, (PECVD), procedures, to a thickness between about 1000 to 3000 Angstroms. Conventional photolithographic and reactive ion etching, (RIE), procedures, using $CHF_3$ as an etchant for first insulator layer 5, and using $Cl_2$ as an etchant for polysilicon layer 4, are used to create polysilicon gate structure 8, comprised of first insulator layer 5, and polysilicon layer 4, shown schematically in FIG. 1. Photoresist removal is accomplished via plasma oxygen ashing and careful wet cleans.

A source/drain region 6, is next formed via ion implantation of phosphorous, at an energy between about 20 to 50 KeV, at a dose between about 1E13 to 1E14 atoms/cm². An insulator layer, comprised of silicon oxide, or silicon nitride, is deposited using either LPCVD or PECVD procedures, at a temperature between about 400 to 700° C., to a thickness between about 800 to 2000 Angstroms, followed by an anisotropic RIE procedure, using $CF_4$ or $CHF_3$ as an etchant, creating insulator spacers 7, on the sides of polysilicon gate structures 6. This is schematically shown in FIG. 1.

Figure 2:
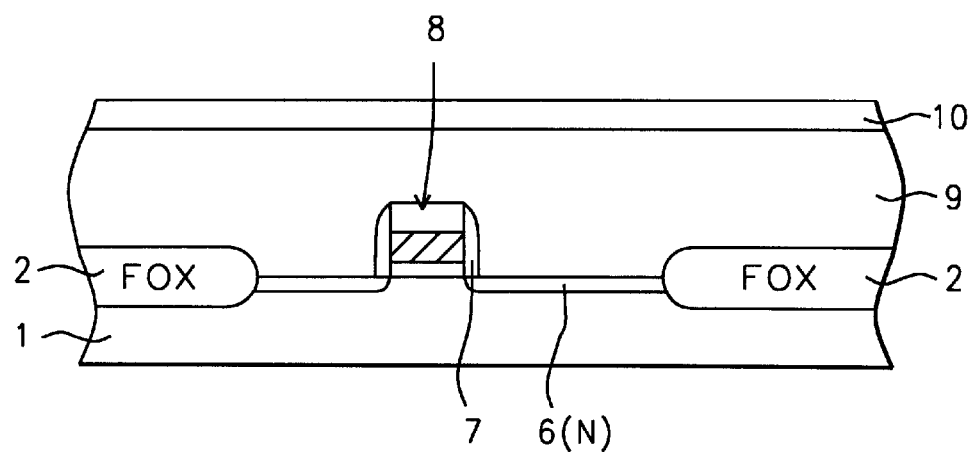
Figure 3:
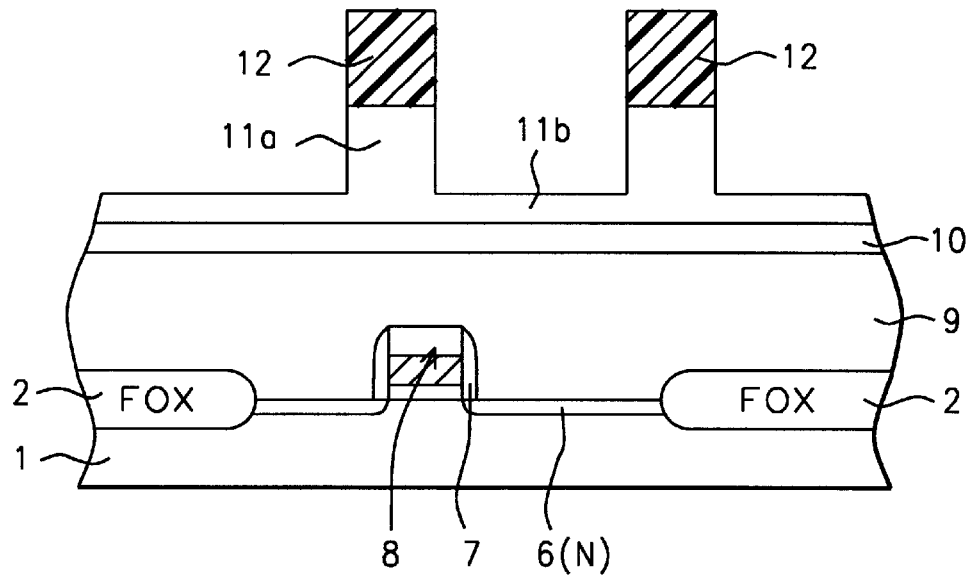

Silicon oxide layer 9, is next deposited using LPCVD or PECVD procedures, at a temperature between about 400 to 800° C., to a thickness between about 3000 to 7000 Angstroms, followed by a planarization procedure, using a chemical mechanical polishing, (CMP), procedure, creating a smooth top surface for silicon oxide layer 9. A silicon nitride layer 10, is next deposited, using LPCVD or PECVD procedures, to a thickness between about 200 to 1000 Angstroms. The result of these depositions are schematically shown in FIG. 2. A silicon oxide layer 11, is deposited via PECVD or LPCVD procedures, using tetraethylorthosilicate, (TEOS), as a source, to a thickness between about 5000 to 12000 Angstroms. Photoresist shapes 12, are formed and used as mask, during an anisotropic RIE procedure, using $CHF_3$ as an etchant, creating silicon oxide mesas 11a, shown schematically in FIG. 3. Silicon oxide mesas 11a, are formed by removing between about 1000 to 10000 Angstroms of exposed regions of silicon oxide layer 11, resulting in silicon oxide mesas 11a, at a height between about 4000 to 10000 Angstroms, with a remaining, thinned silicon oxide layer 11b, between about 500 to 2000 Angstroms, located between silicon oxide mesas. This is schematically shown in FIG. 3.

Figure 4:
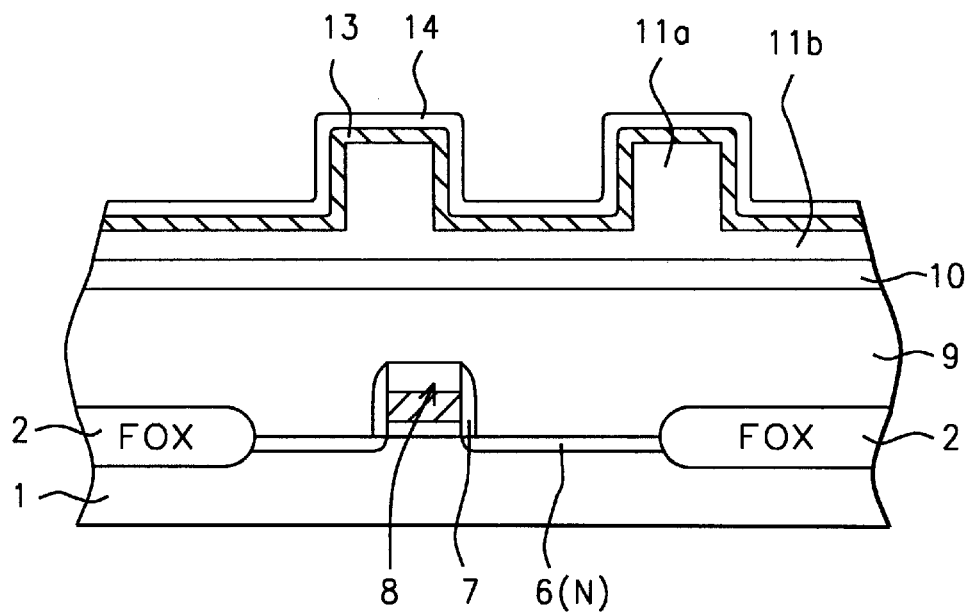
Figure 5:
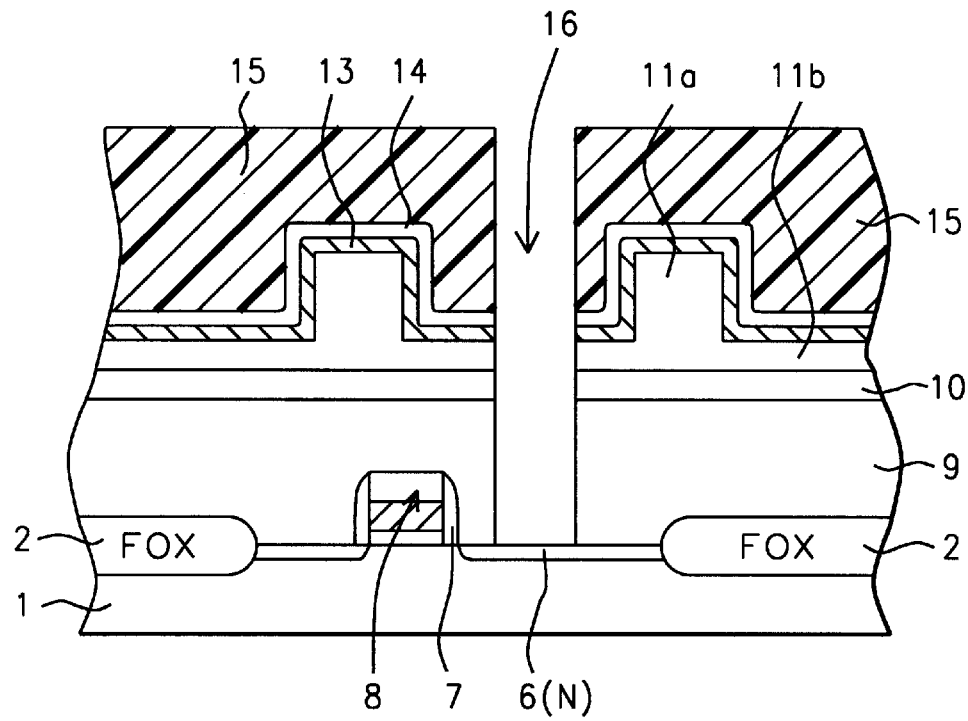

After removal of photoresist shapes 12, via plasma oxygen ashing and careful wet cleans, a polysilicon layer 13, is deposited, via LPCVD procedures, to a thickness between about 500 to 1000 Angstroms. Polysilicon layer 13, doped in situ during deposition via the addition of arsine, or phosphine, to a silane ambient, traverses the underlying topography, created by silicon oxide mesas 11a, resulting in polysilicon layer 13, residing on the sides of silicon oxide mesa 11a, on the top surface of silicon oxide mesa 11a, and on the top surface of silicon oxide layer 11b, located between silicon oxide mesas 11a. Another silicon oxide layer 14, is next deposited, via LPCVD or PECVD procedures, to a thickness between about 500 to 1000 Angstroms, using TEOS as a source. Silicon oxide layer 14, shown schematically in FIG. 4, completely contours underlying polysilicon layer 13. Photoresist shape 15, is used as a mask during an anisotropic RIE procedure, used to create storage node opening 16, exposing source/drain region 6. The anisotropic RIE procedure is performed using $CHF_3$ as an etchant for silicon oxide layer 14, using $Cl_2$ as an etchant for polysilicon layer 13, using $CHF_3$ again as an etchant for thinned silicon oxide layer 11b, using CF$_4$ or SF$_6$ as an etchant for silicon nitride layer 10, and finally again using CHF$_3$ as an etchant for silicon oxide layer 9. Storage node opening 16, located between silicon oxide mesas 11a, is shown schematically in FIG. 5.

Figure 6:
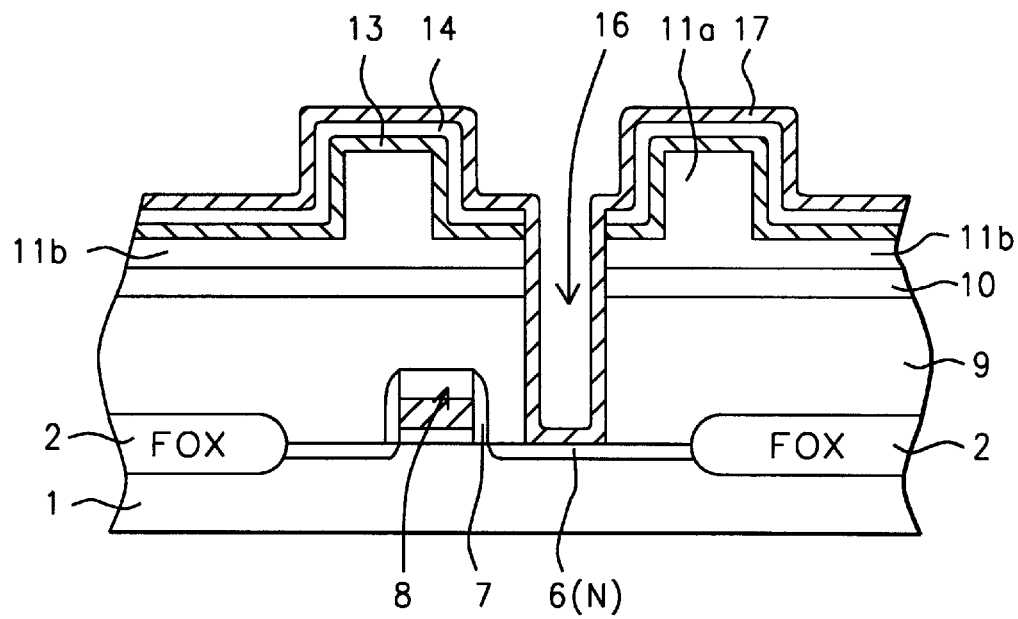
Figure 7:
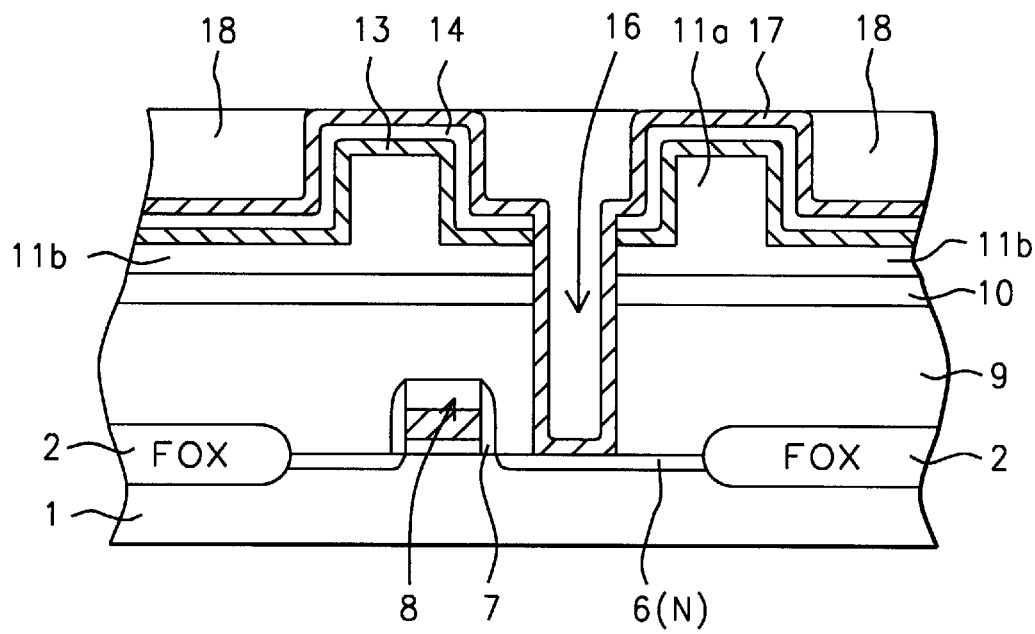
Figure 8:
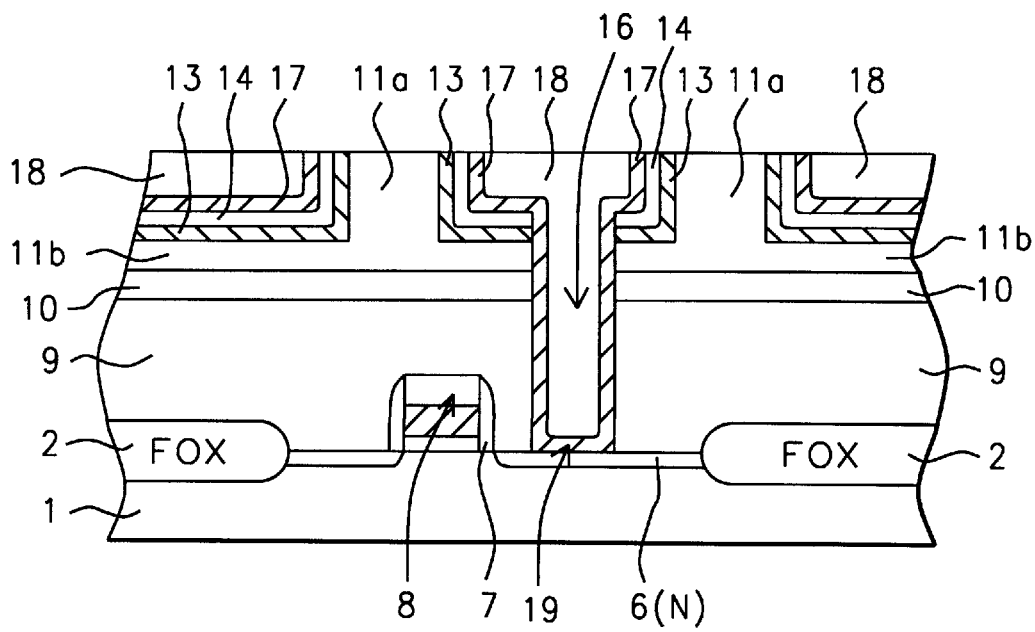

After removal of photoresist shape 15, via plasma oxygen ashing and careful wet cleans, polysilicon layer 17, is deposited, via LPCVD procedures, to a thickness between about 500 to 1000 Angstroms, and again doped in situ, during deposition, via the addition of arsine, or phosphine, to a silane ambient. Polysilicon layer 17, shown schematically in FIG. 6, contours the topography created by silicon oxide mesas 11a, while overlaying silicon oxide layer 14. The desired contact between polysilicon layer 17, and polysilicon layer 13, occurs in the region in which polysilicon layer 17, located on the sides of storage node opening 16, interfaces the edge of the patterned polysilicon layer 13. A thick silicon oxide layer 18, is next deposited, via LPCVD or PECVD procedures, to a thickness between about 5000 to 20000 Angstroms, completely filling storage node opening 16, using TEOS as a source. A chemical mechanical polishing, (CMP), procedure is than employed to planarize thick silicon oxide layer 18, and to expose the top surface of polysilicon layer 17, located directly overlaying silicon mesas 11a. The result of these procedures are schematically shown in FIG. 7. The CMP procedure is than continued to remove the exposed regions of polysilicon layer 17, the exposed regions of silicon oxide layer 14, residing on underlying polysilicon layer 13, and than continued to remove exposed regions of polysilicon layer 13. The CMP procedure also removes a portion of thick silicon oxide layer 18, resulting in the planar structure shown schematically in FIG. 8. The result of the CMP procedure is to divide the continuous polysilicon layers into individual polysilicon branches, to be used as components of the now formed storage node electrode 19, comprised of stacks of horizontal and vertical features. Therefore the removal of the top pieces of polysilicon layer 17, resulted in a first polysilicon branch, containing both vertical and horizontal polysilicon segments, while the CMP procedure, applied to polysilicon layer 13, resulted in a second polysilicon branch, again containing vertical polysilicon segments, attached to underlying horizontal polysilicon segments. The division of the polysilicon layers, into individual segments, shown above via a CMP procedure, can also be accomplished using reactive ion etching procedures, using Cl$_2$ as an etchant for polysilicon, while using CHF$_3$ as an etchant for silicon oxide layers.

Figure 9:
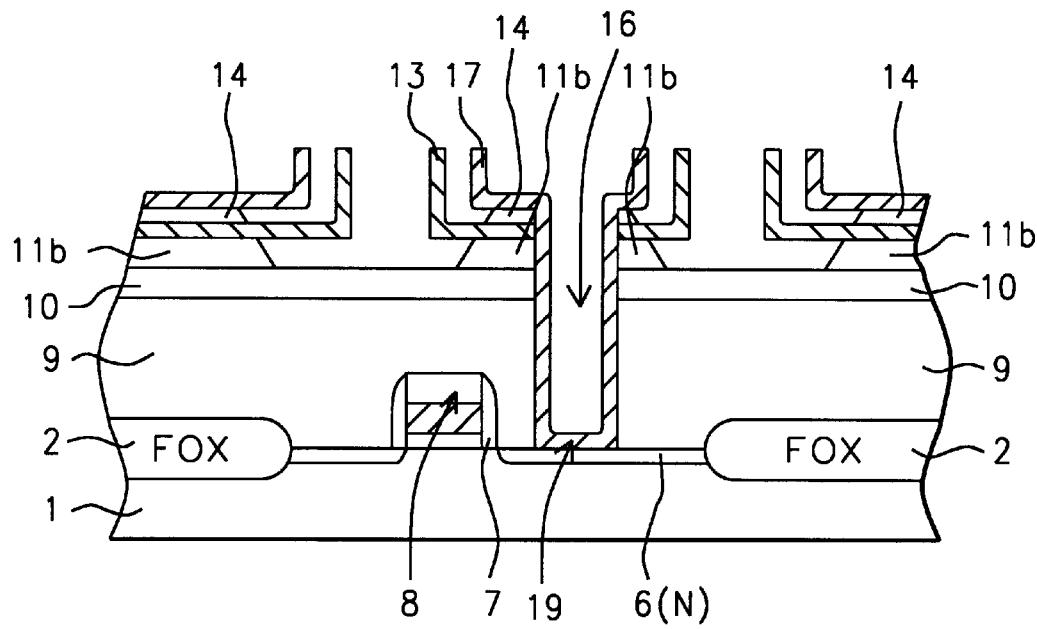

A critical procedure of removing a portion of insulator material, from between the stacks of polysilicon layers, of storage node electrode 19, is next addressed. A wet etch, using a buffered hydrofluoric acid solution, is used to remove all of thick silicon oxide layer 18, and to remove insulator mesas 11a, The wet etch procedure is also used to remove a portion of silicon oxide layer 14, from between polysilicon branches, or from between polysilicon layer 17, and polysilicon layer 13, and is used to remove a portion of thinned silicon oxide layer 11b, located between the second polysilicon branch, or polysilicon layer 13, and silicon nitride layer 10. This timed wet etch procedure results in a remaining segment of silicon oxide layer 14, used as a support between polysilicon layer 17, and polysilicon layer 13, and a remaining segment of silicon oxide layer 11b, used to support polysilicon layer 13. This is schematically shown in FIG. 9. The timed wet etched is designed to expose as much of the polysilicon surface, of storage node electrode 19, as possible, without degrading the needed structural support supplied by the residual segments of silicon oxide layer 14, and silicon oxide layer 11b. Underlying silicon oxide layer 9, was protected by silicon nitride layer 10, during the wet etch procedure.

Figure 10:
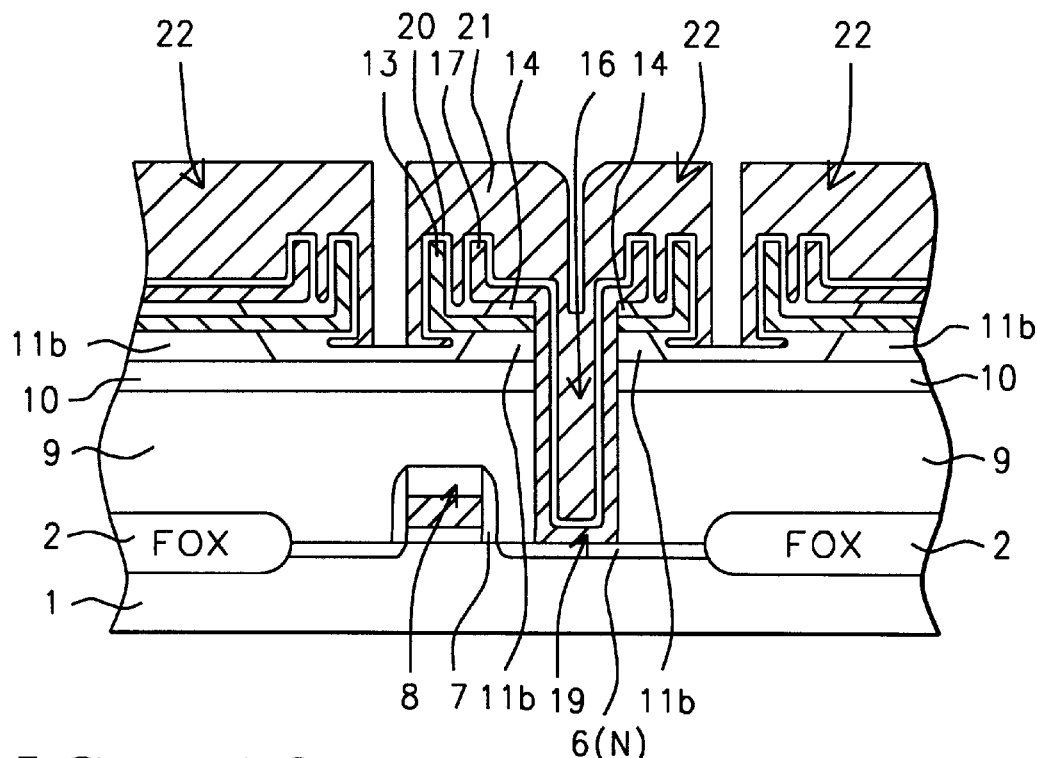

FIG. 10, schematically shows the completion of a stacked capacitor structure 22, comprised of a storage node electrode 19, featuring polysilicon branches, comprised of stacks of vertical and horizontal, polysilicon features. A capacitor dielectric layer 20, comprised of a composite dielectric layer of Oxidized silicon Nitride on silicon Oxide, (ONO), at an equivalent silicon oxide thickness of between about 50 to 80 Angstroms, is formed on the exposed polysilicon surfaces of storage node structure 19, which is comprised of second and first polysilicon branches, or portions of polysilicon layer 17, and portions of polysilicon layer 13. The ONO layer is created by initially creating a native, silicon oxide layer, between about 10 to 20 Angstroms in thickness, on the surface of polysilicon storage node electrode 19, followed by deposition of a thin layer of silicon nitride, via an LPCVD procedure, to a thickness between about 40 to 80 Angstroms. An oxidation procedure, performed in an oxygen—steam ambient, is next used to convert the surface of the silicon nitride layer, to a silicon oxynitride layer, thus creating the ONO layer. The amount of polysilicon surface interfaced by the capacitor dielectric layer 20, is related to the amount of silicon oxide previously removed via the wet buffered etch procedure. After creation of capacitor dielectric layer 20, another polysilicon layer is deposited, via LPCVD procedures, to a thickness between about 500 to 2000 Angstroms. The polysilicon layer can be grown using in situ doping techniques, or grown intrinsically and doped via ion implantation procedures, using arsenic or phosphorous. Conventional photolithographic and RIE procedure, using Cl$_2$ as an etchant are used to create upper electrode, or capacitor plate 21, shown schematically in FIG. 10. Photoresist removal is once again performed, using plasma oxygen ashing and careful wet cleans, resulting in stacked capacitor structure 22, featuring increased capacitor surface area, and thus increased capacitance, resulting from the use of a storage node electrode, comprised of stacks of polysilicon branches, featuring vertical and horizonal polysilicon shapes.

While this invention has been particularly shown and described with reference to the preferred embodiments thereof, it will be understood by those skilled in the art that various changes in form and details may be made without departing from the spirit and scope of the invention.

What is claimed is:

1. A method of fabricating a stacked capacitor structure for a DRAM device, comprising the steps of:

providing a transfer gate transistor, on a semiconductor substrate, comprised of a polysilicon gate structure, on a gate insulator layer, with a source/drain region in said semiconductor substrate, in a region of said semiconductor substrate, not covered by said polysilicon gate structure;

depositing a composite insulator layer;

depositing a first insulator layer;

patterning of said first insulator layer to form insulator mesas, leaving a thinned first insulator layer remaining between said insulator mesas;

depositing a first polysilicon layer;

depositing a second insulator layer;

forming a storage node opening, between said insulator mesas, in said second insulator layer, in said first polysilicon layer, in said thinned first insulator layer, and in said composite insulator layer, exposing said source/drain region;

depositing a second polysilicon layer on said second insulator layer, and on exposed sides of said storage node opening, with said second polysilicon layer contacting an edge of said first polysilicon layer, exposed on the sides of said storage node opening;

depositing a third insulator layer on said second polysilicon layer, completely filling said storage node opening;

planarizing said third insulator layer, exposing a horizontal portion of said second polysilicon layer, in a region in which said second polysilicon layer overlays a top surface of said insulator mesas;

removing exposed, horizontal portion of said second polysilicon layer, exposing a horizontal portion of underlying, said second insulator layer, and creating a first polysilicon branch, comprised of a segment of said second polysilicon layer, on the sides of said storage node opening, contacting the edge of said first polysilicon layer, exposed on the sides of said storage node opening;

removing exposed, horizontal portion of said second insulator layer, exposing a horizontal portion of said first polysilicon layer, in a region in which said first polysilicon layer directly overlays the top surface of said insulator mesas;

removing exposed, horizontal portion of said first polysilicon layer, creating a second polysilicon branch, and forming said storage node electrode comprised of said first polysilicon branch, contacting said second polysilicon branch, on the sides of said storage node opening;

performing a wet etch procedure, comprised of removing said third insulator layer, removing insulator mesas, removing a portion of said second insulator layer, leaving a segment of said second insulator layer between said first polysilicon branch and said second polysilicon branch, and removing a portion of said thinned first insulator layer, leaving a segment of said thinned first insulator layer between said second polysilicon branch and said composite insulator layer;

forming a capacitor dielectric layer on exposed surfaces of said first polysilicon branch, and on exposed surfaces of said second polysilicon branch; and forming a capacitor plate electrode, on said capacitor dielectric layer.

2. The method of claim 1, wherein said composite insulator layer is comprised of an underlying silicon oxide layer, deposited using LPCVD or PECVD procedures, to a thickness between about 3000 to 7000 Angstroms, and an overlying silicon nitride layer, deposited using LPCVD or PECVD procedures, to a thickness between about 200 to 1000 Angstroms.

3. The method of claim 1, wherein said first insulator layer is silicon oxide, obtained via LPCVD or PECVD procedures, at a thickness between about 5000 to 12000 Angstroms, using TEOS as a source.

4. The method of claim 1, wherein said insulator mesas are silicon oxide, formed by patterning of said first insulator layer via an anisotropic RIE procedure, using $CHF_3$ as an etchant, with said insulator mesas having a height between about 4000 to 10000 Angstroms, and with said thinned first insulator layer, located between said insulator mesas, having a thickness between about 500 to 2000 Angstroms.

5. The method of claim 1, wherein said first polysilicon layer is deposited using LPCVD procedures, to a thickness between about 500 to 1000 Angstroms, and in situ doped, during deposition, via the addition of arsine, or phosphine, to a silane ambient.

6. The method of claim 1, wherein said second insulator layer is silicon oxide, deposited using LPCVD or PECVD procedures, to a thickness between about 500 to 1000 Angstroms, using TEOS as a source.

7. The method of claim 1, wherein said storage node opening is formed in said second insulator layer, in said first polysilicon layer, in said thinned first insulator layer, and in said composite layer, via an anisotropic RIE procedure, using $CHF_3$ as an etchant for said second insulator layer, for said thinned first insulator layer, and for the silicon oxide layer of said composite insulator layer, while using $Cl_2$ as an etchant for said first polysilicon layer, and using $CF_4$ or $SF_6$ as an etchant for the silicon nitride layer of said composite insulator layer.

8. The method of claim 1, wherein said second polysilicon layer is deposited using LPCVD procedures, to a thickness between about 500 to 1000 Angstroms, and doped in situ, during deposition, via the addition of arsine, or phosphine, to a silane ambient.

9. The method of claim 1, wherein said third insulator layer is silicon oxide, deposited using LPCVD or PECVD procedures, to a thickness between about 5000 to 20000 Angstroms, using TEOS as a source.

10. The method of claim 1, wherein said exposed horizontal portions of said second polysilicon layer, said exposed horizontal portions of said second insulator layer, and said exposed horizontal portions of said first polysilicon layer, are removed via a chemical mechanical polishing procedure, or via a reactive ion etching procedure.

11. The method of claim 1, wherein said third insulator layer, said insulator mesas, said portion of said second insulator layer, and said portion of said thinned first insulator layer, are removed using a buffered hydrofluoric acid solution.

12. A method for fabricating a stacked capacitor structure, for a DRAM device, on a semiconductor substrate, wherein the surface area of the stacked capacitor structure is increased by creating a storage node electrode, comprised of stacks of vertical and horizontal polysilicon features, comprising the steps of:

providing a transfer gate transistor, comprised of a polysilicon gate structure, on an underlying gate insulator layer, and a source/drain region in said semiconductor substrate, in a region of said semiconductor substrate, not covered by said polysilicon gate structure;

depositing a first silicon oxide layer;

planarizing said first silicon oxide layer;

depositing a silicon nitride layer;

depositing a second silicon oxide layer;

patterning of said second silicon oxide layer, to form silicon oxide mesas, while leaving a thinned second silicon oxide layer between said silicon oxide mesas;

depositing a first polysilicon layer, on said silicon oxide mesas, and on said thinned second silicon oxide layer;

depositing a third silicon oxide layer on said first polysilicon layer;

forming a storage node opening, between said silicon oxide mesas, in said third silicon oxide layer, in said first polysilicon layer, in said thinned second silicon oxide layer, in said silicon nitride layer, and in said first silicon oxide layer, exposing a top surface of said source/drain region;

depositing a second polysilicon layer on said third silicon oxide layer, and on exposed surfaces of said storage node opening, contacting exposed edge of said first polysilicon layer, in said storage node opening;

depositing a fourth silicon oxide layer on said second polysilicon layer, and completely filling said storage node opening;

planarizing said fourth silicon oxide layer, exposing a top surface of said second polysilicon layer, in a region in which said second polysilicon layer resides overlying a top surface of said silicon oxide mesas;

removing exposed regions of said second polysilicon layer, exposing a top surface of said third silicon oxide layer, in a region in which said third silicon oxide layer resides overlying the top surface of said silicon oxide mesas, and creating a first polysilicon branch comprised of vertical polysilicon segments, located on the sides of said storage node opening, and horizontal polysilicon segments, and with said first polysilicon branch contacting an edge of said first polysilicon layer, exposed in said storage node opening;

removing exposed regions of said third silicon oxide layer, exposing a top surface of said first polysilicon layer, in a region in which said first polysilicon layer resides overlying the top surface of said silicon oxide mesas;

removing exposed regions of said first polysilicon layer, exposing the top surface of said silicon oxide mesas, and creating a second polysilicon branch, comprised of vertical polysilicon segments, on the sides of said silicon oxide mesas, and horizontal polysilicon segments, overlaying said thinned second silicon oxide layer, and forming said storage node electrode comprised of said first polysilicon branch, and said second polysilicon branch;

removing all of said fourth silicon oxide layer, removing all of said silicon oxide mesas, removing a portion of said third silicon oxide layer, leaving a third silicon oxide segment between said first polysilicon branch and said second polysilicon branch, and removing a portion of said thinned second silicon oxide layer, leaving a thinned second silicon oxide segment between said second polysilicon branch and said silicon nitride layer;

forming a capacitor dielectric layer on the exposed surfaces of said first polysilicon branch, and on exposed surface of said second polysilicon branch, of said storage node electrode;

depositing a third polysilicon layer; and patterning of said third polysilicon layer to form a capacitor plate for said stacked capacitor structure.

13. The method of claim 12, wherein said first silicon oxide layer is deposited using LPCVD or PECVD procedures, to a thickness between about 3000 to 7000 Angstroms.

14. The method of claim 12, wherein said silicon nitride layer is deposited using LPCVD or PECVD procedures, to a thickness between about 200 to 1000 Angstroms.

15. The method of claim 12, wherein said second silicon oxide layer is deposited using LPCVD or PECVD procedures, to a thickness between about 5000 to 12000 Angstroms, using TEOS as a source.

16. The method of claim 12, wherein said silicon oxide mesas are formed via patterning of said second silicon oxide layer, via an anisotropic RIE procedure, using $CHF_3$ as an etchant.

17. The method of claim 12, wherein the height of said silicon oxide mesas is between about 4000 to 10000 Angstroms, while the thickness of said thinned second silicon oxide layer is between about 500 to 2000 Angstroms.

18. The method of claim 12, wherein said first polysilicon layer is deposited using LPCVD procedures, to a thickness between about 500 to 1000 Angstroms, and doped in situ, during deposition, via the addition of arsine, or phosphine, to a silane ambient.

19. The method of claim 12, wherein said third silicon oxide layer is deposited using LPCVD or PECVD procedures, to a thickness between about 500 to 1000 Angstroms, using TEOS as a source.

20. The method of claim 12, wherein said second polysilicon layer is deposited using LPCVD procedures, to a thickness between about 500 to 1000 Angstroms, and doped in situ, during deposition, via the addition of arsine, or phosphine, to a silane ambient.

21. The method of claim 12, wherein said fourth silicon oxide layer is deposited using LPCVD or PECVD procedures, to a thickness between about 5000 to 20000 Angstroms, using TEOS as a source.

22. The method of claim 12, wherein said first polysilicon branch, and said second polysilicon branch, are formed via removal of exposed portions of said second polysilicon layer, removal of exposed portions of said third silicon oxide layer, and removal of exposed portions of said first polysilicon layer, via a chemical mechanical polishing procedure.

23. The method of claim 12, wherein said third silicon oxide segment, and said thinned second silicon oxide segment, are formed via removal of a portion of said third silicon oxide layer, and via removal of a portion of said thinned second silicon oxide layer, using a buffered hydrofluoric acid solution.

24. The method of claim 12, wherein said capacitor dielectric layer is a ONO layer, (Oxidized silicon Nitride on Oxide), composed of silicon oxynitride—silicon nitride—silicon oxide, obtained via: the growth of a native oxide on the top surface of said polysilicon storage node electrode, at a thickness between about 10 to 20 Angstroms; LPCVD deposition of a silicon nitride layer, to a thickness between about 40 to 80 Angstroms; and an oxidation to convert the top portion of said silicon nitride layer, to a silicon oxynitride layer.

* * * * *